United States Patent
Zhang (10) Patent No.: US 10,050,228 B2
(45) Date of Patent: Aug. 14, 2018

(54) OLED DISPLAY DEVICE AND ENCAPSULATION METHOD THEREOF

(71) Applicant: BOE TECHNOLOGY GROUP CO., LTD., Beijing (CN)

(72) Inventor: Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/570,344

(22) Filed: Dec. 15, 2014

(65) Prior Publication Data
US 2016/0043348 A1    Feb. 11, 2016

(30) Foreign Application Priority Data
Aug. 5, 2014 (CN) .......................... 2014 1 0381365

(51) Int. Cl.
*H01L 27/32* (2006.01)
*H01L 51/52* (2006.01)

(52) U.S. Cl.
CPC ...... *H01L 51/5256* (2013.01); *H01L 27/3246* (2013.01); *H01L 27/3258* (2013.01)

(58) Field of Classification Search
CPC ............. H01L 51/5256; H01L 27/3246; H01L 27/3258
See application file for complete search history.

(56) References Cited

U.S. PATENT DOCUMENTS

| 2003/0017297 A1* | 1/2003 | Song ................... H01L 51/5253 428/68 |
| 2003/0164674 A1* | 9/2003 | Imamura ................ H05B 33/04 313/493 |
| 2004/0081852 A1* | 4/2004 | Chen ................... H01L 51/5253 428/690 |
| 2005/0156513 A1 | 7/2005 | Sano et al. |
| 2006/0033429 A1 | 2/2006 | Fujimura et al. |
| 2014/0065739 A1* | 3/2014 | Chen ....................... H01L 51/56 438/26 |
| 2014/0132148 A1 | 5/2014 | Jang et al. |

(Continued)

FOREIGN PATENT DOCUMENTS

| CN | 1645975 A | 7/2005 |
| CN | 1735292 A | 2/2006 |
| JP | 2010-080345 A | 4/2010 |

OTHER PUBLICATIONS

First Chinese Office Action dated Mar. 8, 2016; Appln. No. 201410381365.3.

(Continued)

*Primary Examiner* — Shaun Campbell
*Assistant Examiner* — Aneta Cieslewicz
(74) *Attorney, Agent, or Firm* — Ladas & Parry LLP (57) ABSTRACT

Embodiments of the disclosure provide an Organic Light-Emitting Diode (OLED) display device and an encapsulation method thereof. The encapsulation method of the OLED display device comprises: providing a display substrate, the display substrate having a display region and a peripheral region provided outside the display region; forming a dam in the peripheral region of the display substrate; and forming a plurality of thin film encapsulation layers on the display substrate by using a single mask plate, wherein the plurality of thin film encapsulation layers envelop the dam therein.

20 Claims, 3 Drawing Sheets

(56) References Cited

U.S. PATENT DOCUMENTS

| | | | |
|---|---|---|---|
| 2014/0145155 A1* | 5/2014 | Park | H01L 27/3244 257/40 |
| 2015/0060806 A1* | 3/2015 | Park | H01L 51/5253 257/40 |
| 2015/0091030 A1* | 4/2015 | Lee | H01L 27/3246 257/91 |

OTHER PUBLICATIONS

Third Chinese Office Action dated Mar. 20, 2017; Appln. No. 201410381365.3.
Second Chinese Office Action dated Sep. 7, 2016; Appln. No. 201410381365.3.

* cited by examiner

-Prior Art-

FIG. 6 the OLED and an upper thin film encapsulation layer envelops edges of a lower thin film encapsulation layer to better limit or prevent the water vapor and oxygen in the air entering into the OLED from the edges of the thin film encapsulation layers. In this case, it is necessary to respectively form the plurality of thin film encapsulation layers by using a plurality of different mask plates.

OLED DISPLAY DEVICE AND ENCAPSULATION METHOD THEREOF

TECHNICAL FIELD

Embodiments of the disclosure relate to an Organic Light-Emitting Diode (OLED) display device and an encapsulation method thereof.

BACKGROUND

Organic Light-Emitting Diode (OLED) display device has become a very important display technology in the field of flat panel display, due to its advantages such as small thickness, light weight, wide viewing angle, self-luminescence, capable of continuously adjusting wavelengths of light, low cost, rapid response, low power consumption, wide operation temperature range, simple production process, high luminescence efficiency, suitable for flexible display and the like.

Substances such as water vapor and oxygen in the air have a great influence on the service life of OLED in the OLED display device. Cathode of the OLED is typically made of metals such as aluminum, magnesium and calcium, and these metals are apt to react with the water vapor and oxygen permeated into the OLED display device because of their relatively active chemical nature. In addition, the water vapor and oxygen will also react with a hole transporting layer and an electron transporting layer of the OLED, and these reactions will cause failure of the OLED. Therefore, an effective encapsulation of the OLED display device to sufficiently separate respective functional layers of the OLED from the water vapor, oxygen and other substances in the atmosphere can greatly prolong the service life of the OLED and the service life of the OLED display device.

Encapsulation method of the OLED display device typically comprises two types: substrate encapsulation and thin film encapsulation (TFE). The substrate encapsulation refers to filling a glue film between a display substrate formed with the OLED and an encapsulation substrate, so that the glue film after being cured allows an airtight space to be formed between the display substrate and the encapsulation substrate. The thin film encapsulation refers to covering the surface of the OLED with a thin film encapsulation layer consisting of an inorganic thin film and an organic thin film, so that it is difficult for the water and oxygen to penetrate into the OLED.

Figure 1:
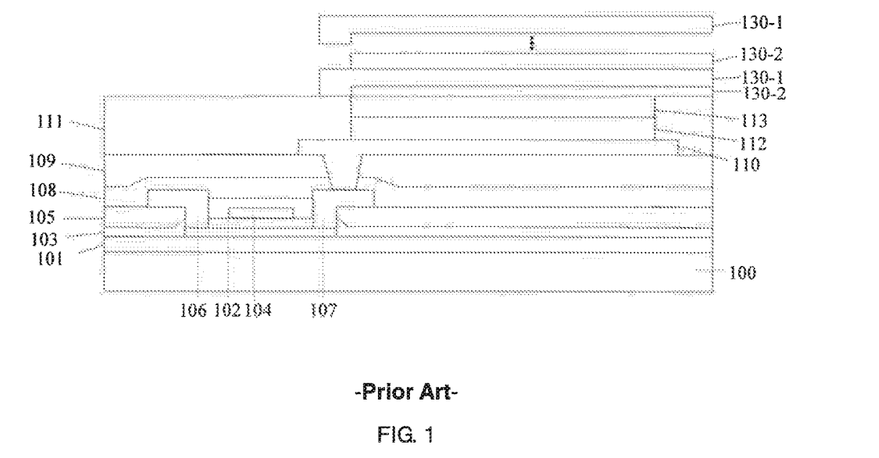
FIG. 1 is a cross-section view illustrating an OLED display device using thin film encapsulation.

FIG. 1 is a schematic cross-section view illustrating an OLED display device using thin film encapsulation. As shown in FIG. 1, the OLED display device comprises the thin film encapsulation layer covering the OLED (comprising a first electrode 110, a second electrode 113, and a light-emitting layer 112 provided therebetween), the thin film encapsulation layer comprises a plurality of first thin film encapsulation layers 130-1 and a plurality of second thin film encapsulation layers 130-2 which are alternately stacked. The first thin film encapsulation layer 130-1 is formed to be larger than the second thin film encapsulation layer 130-2 and envelops edges of the second thin film encapsulation layer 130-2, in order to limit prevent the water vapor and oxygen in the air entering into the OLED from the edges of the thin film encapsulation layer. In this case, it is necessary to respectively form the first thin film encapsulation layer 130-1 and the second thin film encapsulation layer 130-2 by using two different mask plates. Further, according to one technique, a plurality of thin film encapsulation layers with gradually increasing sizes are sequentially formed on As can be seen above, it is necessary to implement the thin film encapsulation by using at least two mask plates and to frequently replace the mask plates, which will increase production cost and render the production process complicated.

SUMMARY

According to embodiments of the disclosure, there is provided an encapsulation method of an OLED display device. The method comprises: providing a display substrate, the display substrate having a display region and a peripheral region provided outside the display region; forming a dam in the peripheral region of the display substrate; and forming a plurality of thin film encapsulation layers on the display substrate by using a single mask plate, wherein the plurality of thin film encapsulation layers envelop the dam therein.

For example, the display region of the display substrate has a plurality of pixel units arranged in a matrix; the display substrate comprises a pixel defining layer for defining the plurality of pixel units; and the method comprises: forming the dam on the pixel defining layer.

For example, the encapsulation method comprises: integrally forming the dam with the pixel defining layer.

For example, the display region of the display substrate has a plurality of pixel units arranged in a matrix; the display substrate comprises: a pixel defining layer for defining the plurality of pixel units; and a planarization layer provided below the pixel defining layer and planarizing the display substrate; and the method comprises: forming the dam on the planarization layer, and forming the pixel defining layer between the dam and the plurality of thin film encapsulation layers, wherein the pixel defining layer envelops the dam therein.

For example, the encapsulation method comprises: integrally forming the dam with the planarization layer.

For example, the display region of the display substrate has a plurality of pixel units arranged in a matrix, and each pixel unit comprises an OLED and a driving TFT for driving the OLED; the display substrate comprises: a pixel defining layer for defining the plurality of pixel units; a planarization layer provided below the pixel defining layer and planarizing the display substrate; and a passivation layer provided below the planarization layer and separating the driving TFT from the OLED; and the method comprises: forming the dam on the passivation layer, and sequentially forming the planarization layer and the pixel defining layer between the dam and the plurality of thin film encapsulation layers, wherein the planarization layer and the pixel defining layer envelop the dam therein.

For example, the encapsulation method comprises: integrally forming the dam with the passivation layer.

For example, the mask plate has an opening, and the opening is larger than or equal to a region surrounded by an outmost edge of the dam; upon placing the mask plate on the display substrate, the opening just exposes the whole dam; or upon placing the mask plate on the display substrate, the opening exposes the whole dam and further exposes a portion of the surface of the display substrate which is provided outside the dam.

For example, a shape of a cross section of the dam taken along a direction perpendicular to the display substrate is a trapezoid with a width of an upper side less than a width of a lower side or a rectangular with the width of the upper side equal to the width of the lower side.

For example, the dam is formed as an endless closed ring so as to surround the display region.

According to embodiments of the disclosure, there is provided an OLED display device. The display device comprises: a display substrate, having a display region and a peripheral region provided outside the display region; a dam, formed in the peripheral region of the display substrate; and a plurality of encapsulation layers, formed on the display substrate and enveloping the dam therein.

For example, the display region of the display substrate has a plurality of pixel units arranged in a matrix; the display substrate comprises a pixel defining layer for defining the plurality of pixel units; and the dam is formed on the pixel defining layer.

For example, the dam is integrally formed with the pixel defining layer.

For example, the display region of the display substrate has a plurality of pixel units arranged in a matrix; the display substrate comprises: a pixel defining layer for defining the plurality of pixel units; and a planarization layer provided below the pixel defining layer and planarizing the display substrate; and the dam is formed on the planarization layer, the pixel defining layer is formed between the dam and the plurality of thin film encapsulation layers, and the pixel defining layer envelops the dam therein.

For example, the dam is integrally formed with the planarization layer.

For example, the display region of the display substrate has a plurality of pixel units arranged in a matrix, and each pixel unit comprises an OLED and a driving TFT for driving the OLED; the display substrate comprises: a pixel defining layer for defining the plurality of pixel units; a planarization layer provided below the pixel defining layer and planarizing the display substrate; and a passivation layer provided below the planarization layer and separating the driving TFT from the OLED; and the dam is formed on the passivation layer, the planarization layer and the pixel defining layer are sequentially formed between the dam and the plurality of thin film encapsulation layers, and the planarization layer and the pixel defining layer envelop the dam therein.

For example, the dam is integrally formed with the passivation layer.

For example, edges of the plurality of thin film encapsulation layers are provided on an outer wall of the dam, or the edges of the plurality of thin film encapsulation layers are provided on a portion of a surface of the display substrate which is provided outside the dam.

For example, a shape of a cross section of the dam taken along a direction perpendicular to the display substrate is a trapezoid with a width of an upper side less than a width of a lower side or a rectangular with the width of the upper side equal to the width of the lower side.

For example, the dam is formed as an endless closed ring so as to surround the display region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the disclosure belongs. The terms "first," "second," etc., which are used in the description and the claims of the disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

The embodiments of the disclosure provide an OLED display device and an encapsulation method thereof, which can form a plurality of thin film encapsulation layers by using a single mask plate while delay permeation of water vapor and oxygen in the air from edges of the thin film encapsulation layers into an OLED of the OLED display device, thereby prolonging a service life of the OLED, simplifying a thin film encapsulation process and reducing cost of the thin film encapsulation process.

With reference now to FIG. 2 to FIG. 6, the OLED display device and the encapsulation method thereof according to the embodiments of the disclosure will be described in detail.

The encapsulation method of the OLED display device according to the embodiments of the disclosure comprises: providing a display substrate 1, the display substrate 1 having a display region 01 and a peripheral region 02 provided outside the display region 01; forming a dam 30 in the peripheral region 02 of the display substrate 1; and forming a plurality of thin film encapsulation layers 40 on the display substrate by using a single mask plate. The plurality of thin film encapsulation layers 40 envelop the dam 30 therein.

For example, the display region 01 of the display substrate 1 has a plurality of pixel units arranged in a matrix; each pixel unit comprises an OLED and a driving thin film transistor (briefly referred to as TFT) for driving the OLED.

With reference to FIG. 2 to FIG. 5, the display substrate 1 comprises a base substrate 10, and a buffer layer 11, an active layer 12, a gate insulating layer 13, a gate electrode layer, an interlayer insulating layer 15, a source-drain metal layer, a passivation layer 18 and a planarization layer 19 sequentially formed on the base substrate 10. The gate electrode layer comprises a gate electrode 14, and the source-drain metal layer comprises a source electrode 16 and a drain electrode 17. The source electrode 16 and the drain electrode 17 are connected to the active layer 12 through a via-hole passing through the interlayer insulating layer 15 and the gate insulating layer 13. The active layer 12, the gate insulating layer 13, the gate electrode 14, the interlayer insulating layer 15, the source electrode 16 and the drain electrode 17 constitute the driving TFT. The passivation layer 18 separates the driving TFT from the subsequently formed OLED. The planarization layer 19 planarizes a surface of the display substrate 1. It should be noted that, in addition to the driving TFT, the display substrate for example further comprises components such as a switching TFT, a storage capacitor, a gate line, a data line and the like. These components are the same as those in the art, which will not be described here for simplicity.

With further reference to FIG. 2 to FIG. 5, the display substrate 1 further comprises a pixel defining layer 21 and the OLED which are formed on the planarization layer 19. The pixel defining layer 21 defines the plurality of pixel units. The OLED is formed within each pixel unit and comprises a first electrode 20, a second electrode 23 and an organic light-emitting layer 22 disposed between the first electrode 20 and the second electrode 23. For example, the organic light-emitting layer comprises a hole injection layer, a hole transporting layer, a light-emitting layer, an electron transporting layer and an electron injection layer. The first electrode 20 of the OLED is connected to the drain electrode 17 of the driving TFT through a via-hole passing through the planarization layer 19 and the passivation layer 18.

It should be noted that, respective layers of the driving TFT, the passivation layer 18, the planarization layer 19, the pixel defining layer 21 and respective layers of the OLED may be made of any materials by any methods known in the art. The embodiments of the disclosure will not limit these materials and these methods.

It should be noted that, the driving TFT and the OLED may utilize any structures known in the art and the driving TFT and the OLED may have any relative position relationships known in the art. The embodiments of the disclosure will not limit these structures and these relative position relationships.

After the display substrate 1 is provided, the dam 30 is formed in the peripheral region 02 of the display substrate 1. For example, the dam 30 is formed by a patterning process using a single-tone mask plate. For example, the dam has a thickness of about 2~5 μm, and a width of about 50~500 μm.

For example, the dam is made of an inorganic material, and the inorganic material is $Al_2O_3$, $TiO_2$, $ZrO_2$, MgO, $HfO_2$, $Ta_2O_5$, $Si_3N_4$, AlN, SiN, SiNO, SiO, $SiO_2$, $SiO_x$, SiC, ITO or combinations thereof.

For example, the dam is made of an organic material, and the organic material is PET (polyethylene terephthalate), PEN (polyethylene naphthalate), PC (polycarbonate), PI (polyimide), PVC (polyvinyl chloride), PS (polystyrene), PMMA (polymethyl methacrylate), PBT (polybutylene terephthalate), PSO (polysulfone), PES (polyparaphenylene diethyl sulfone), PE (polyethylene), PP (polypropylene), polysiloxane, PA (polyamide), PVDF (polyvinylidene fluoride), EVA (ethylene-vinyl acetate copolymer), EVAL (ethylene-vinyl alcohol copolymer), PAN (polyacrylonitrile), PVAc (polyvinyl acetate), Parylene, Polyurea, PTFE (polytetrafluoroethylene), epoxy resin or combinations thereof.

For example, the dam is made of a combination of one or more of the above-mentioned inorganic materials and one or more of the above-mentioned organic materials.

For example, as to a cross section of the dam 30 taken along a direction perpendicular to the display substrate 1, a width of a upper side of the cross section is less than or equal to a width of a lower side of the cross section, in order that the plurality of thin film encapsulation layers 40 formed subsequently closely cover the OLED and there is no gap between the thin film encapsulation layers 40 and the OLED. Further, for example, a shape of the cross section is a trapezoid with the width of the upper side less than the width of the lower side or a rectangular with the width of the upper side equal to the width of the lower side.

It should be noted that the "upper side" indicates a side of the cross section away from the display substrate 1, and the "lower side" indicates a side of the cross section close to the display substrate 1.

Further, in order that the plurality of thin film encapsulation layers 40 formed subsequently are closely contact the dam 30, for example, the shape of the cross section of the dam is a trapezoid without right angle, that is, right and left sides of the cross section form acute angles with the display substrate 1.

Figure 6:
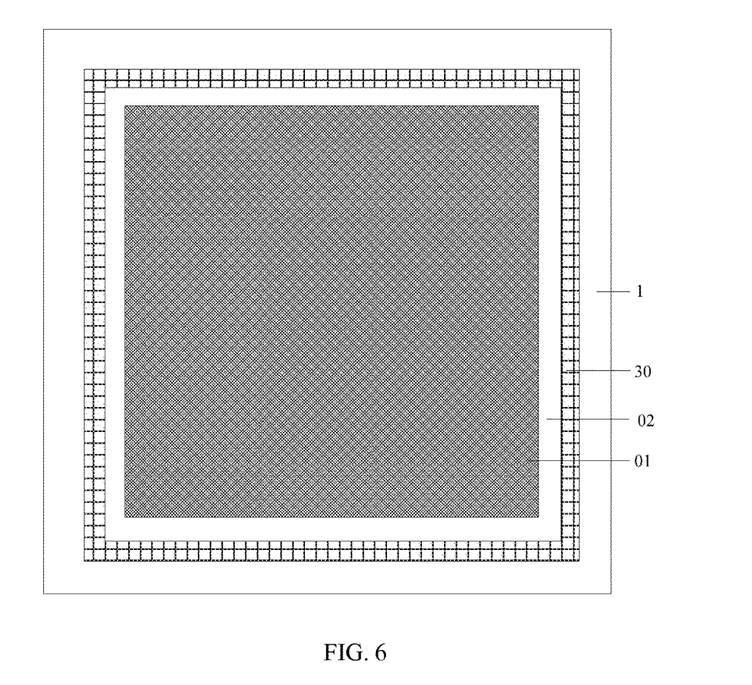
FIG. 6 is a plan view illustrating the OLED display device according to the embodiments of the disclosure.

For example, the dam 30 is formed as an endless closed ring so as to surround the display region 01, as shown in FIG. 6. However, the embodiments of the disclosure are not limited thereto, and the dam 30 may be provided as a ring having an opening as practically required.

With further reference to FIG. 2 to FIG. 5, after formation of the dam 30, the plurality of thin film encapsulation layers 40 are formed by using the single mask plate (not shown), and the plurality of thin film encapsulation layers 40 cover the OLED and envelop the dam 30 therein. For example, the mask plate has an opening, the mask plate is placed on the display substrate 1 after formation of the dam 30, and a plurality of thin films for forming the thin film encapsulation layers are sequentially formed for example by plasma enhanced chemical vapor deposition (briefly referred to as PECVD). After formation of the thin films for forming the thin film encapsulation layers, the mask plate and portions of the thin films for forming the thin film encapsulation layers provided on the non-opening region of the mask plate are removed to obtain the plurality of thin film encapsulation layers 40, and the plurality of thin film encapsulation layers 40 cover the OLED and envelop the dam 30 therein.

Figure 2:
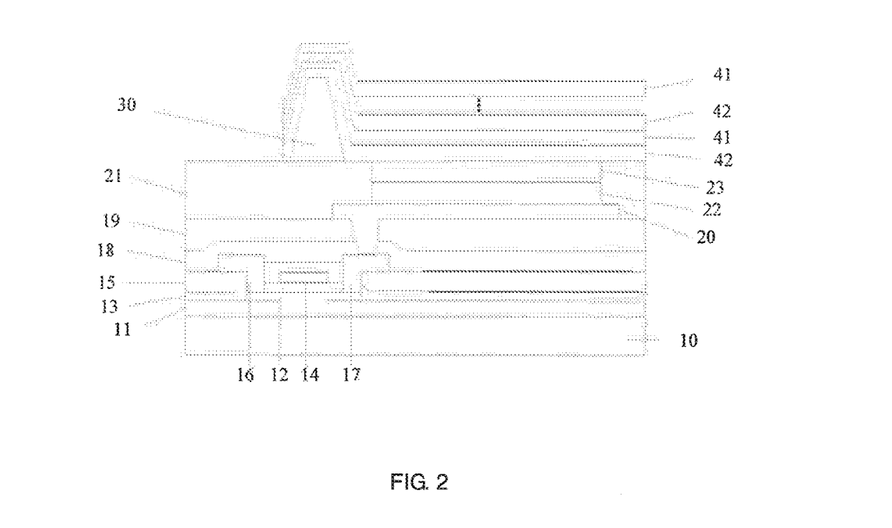
FIG. 2 is a cross-section view illustrating an OLED display device according to embodiments of the disclosure.
Figure 3:
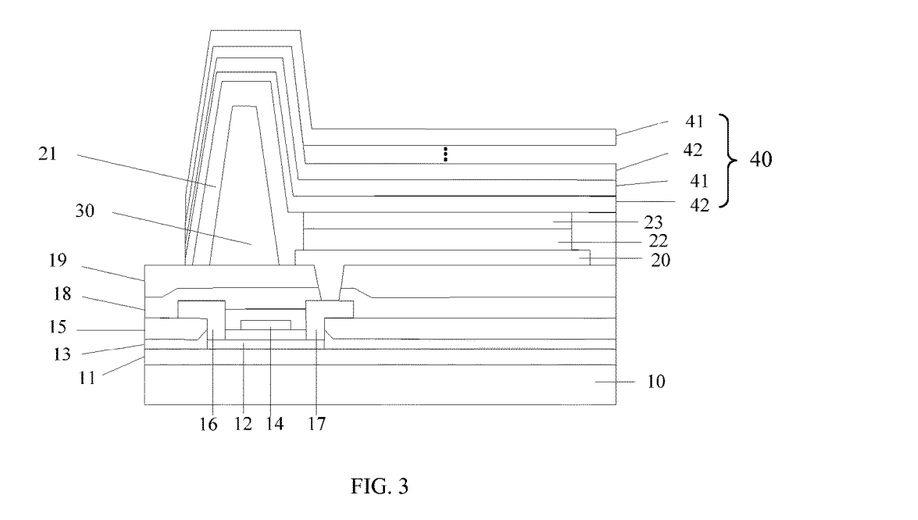
FIG. 3 is a cross-section view illustrating the OLED display device according to the embodiments of the disclosure.
Figure 4:
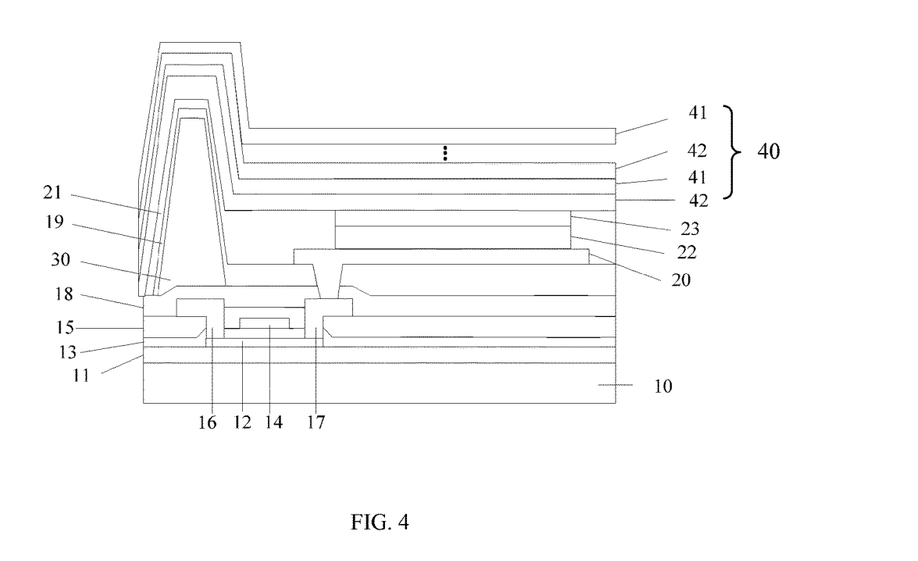
FIG. 4 is a cross-section view illustrating the OLED display device according to the embodiments of the disclosure.

For example, the opening of the mask plate is larger than or equal to a region surrounded by an outmost edge of the dam 30, that is, the opening of the mask plate at least covers the display region of the display substrate and a region from the outmost edge of the dam 30 to the display region. In the case that the opening of the mask plate is equal to the region surrounded by the outmost edge of the dam 30, after the mask plate is placed on the display substrate 1, the opening of the mask plate just exposes the whole dam 30 but does not expose the surface of the display substrate 1 which is provided outside the dam 30. In this case, edges of the plurality of thin film encapsulation layers 40 are provided on an outer wall of the dam 30 as shown in FIG. 2 to FIG. 4, which greatly increases a distance between the edges of the plurality of thin film encapsulation layers 40 and the OLED, so that a distance that the water vapor and oxygen enters from the edges of the plurality of thin film encapsulation layers 40 to the OLED are increased and permeation of water vapor and oxygen from the edges of the plurality of thin film encapsulation layers 40 into the OLED are delayed.

Figure 5:
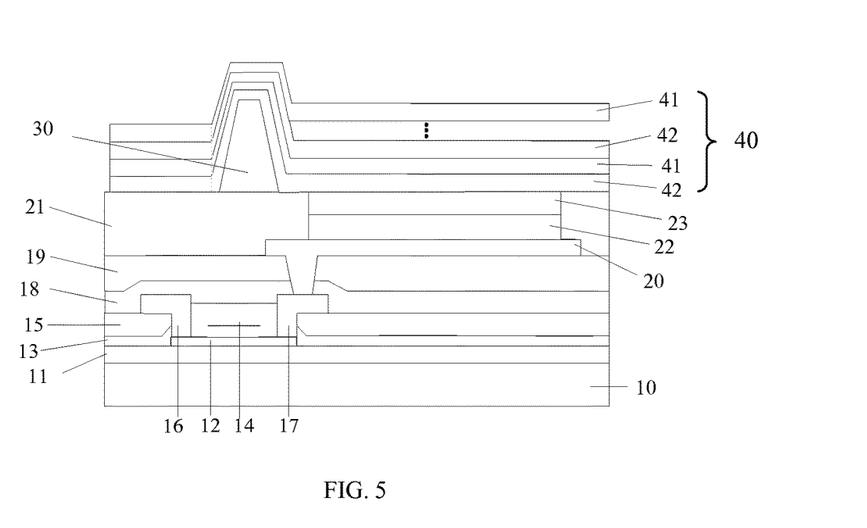
FIG. 5 is a cross-section view illustrating the OLED display device according to the embodiments of the disclosure.

In the case that the opening of the mask plate is larger than the region surrounded by the outmost edge of the dam 30, after the mask plate is placed on the display substrate 1, the opening exposes the whole dam 30 and further exposes a portion of the surface of the display substrate 1 which is provided outside the dam 30. In this case, the edges of the plurality of thin film encapsulation layers 40 are provided on the surface of the display substrate 1 outside the dam 30 as shown in FIG. 5, which further increases the distance between the edges of the plurality of thin film encapsulation layers 40 and the OLED, so that the distance that the water vapor and oxygen enters from the edges of the plurality of thin film encapsulation layers 40 to the OLED are further increased and permeation of the water vapor and oxygen from the edges of the plurality of thin film encapsulation layers 40 into the OLED are further delayed. It should be noted that the outmost edge or the outside of the dam 30 indicates an edge or a side away from the display region.

For example, the region surrounded by the outmost edge of the dam 30 is a region surrounded by an intersecting line where the outer wall of the dam 30 and the display substrate 1 intersect.

For example, the plurality of thin film encapsulation layers 40 comprise a plurality of inorganic thin film encapsulation layers 41 and a plurality of organic thin film encapsulation layers 42 alternately stacked. Here, the specific number of the plurality of thin film encapsulation layers 40 is not limited. For example, taking the ability of resisting oxygen and water and the lighter and thinner appearance into account, 2-20 thin film encapsulation layers 40 are formed. For example, a thickness of the inorganic thin film encapsulation layers 41 is 5-20 nm, and a thickness of the organic thin film encapsulation layers 42 is 5 nm-20 nm. It should be noted that the plurality of thin film encapsulation layers 40 are made of any known materials by any known methods, which will not be limited in the embodiments of the disclosure.

With reference to FIG. 2, the dam 30 is formed on the pixel defining layer 21. In this case, the dam 30 for example is integrally formed with the pixel defining layer 21 in order to simplify the manufacture process. It should be noted that, that "the dam 30 is integrally formed with the pixel defining layer 21" indicates that the dam 30 and the pixel defining layer 21 are formed simultaneously by the same material and the same patterning process.

With reference to FIG. 3, the dam 30 is formed on the planarization layer 19, the pixel defining layer 21 envelops the dam 30 therein, and the plurality of thin film encapsulation layers 40 envelop the pixel defining layer 21 therein, which further increases the distance between the edges of the plurality of thin film encapsulation layers 40 and the OLED. In this case, the dam 30 for example is integrally formed with the planarization layer 19 in order to simplify the manufacture process. Likewise, that "the dam 30 is integrally formed with the planarization layer 19" indicates that the dam 30 and the planarization layer 19 are formed simultaneously by the same material and the same patterning process.

With reference to FIG. 4, the dam 30 is formed on the passivation layer 18, the planarization layer 19 and the pixel defining layer 21 sequentially envelop the dam 30 therein, and the plurality of thin film encapsulation layers 40 envelop the pixel defining layer 21 therein, which further increases the distance between the edges of the plurality of thin film encapsulation layers 40 and the OLED. In this case, the dam 30 for example is integrally formed with the passivation layer 18 in order to simplify the manufacture process. Likewise, that "the dam 30 is integrally formed with the passivation layer 18" indicates that the dam 30 and the passivation layer 18 are formed simultaneously by the same material and the same patterning process.

As shown in FIG. 5, the edges of the plurality of thin film encapsulation layers 40 are provided on the surface of the display substrate 1 outside the dam 30. In this case, although the dam 30 is formed on the pixel defining layer 21 as shown in FIG. 5, the dam 30 may be formed on the planarization layer 19 or the passivation layer 18 similarly as in FIG. 3 or FIG. 4.

In the encapsulation method of the OLED display device according to the embodiments of the disclosure, the dam is formed in the peripheral region of the display substrate 1, the plurality of thin film encapsulation layers are formed on the display substrate by using the single mask plate, and the plurality of thin film encapsulation layers envelop the dam therein. Since the dam is formed in the peripheral region of the display substrate, the plurality of thin film encapsulation layers can be formed on the display substrate by using the single mask plate, which thereby simplifies the thin film encapsulation process and reduces cost of the film encapsulation process. Further, since the dam is formed in the peripheral region of the display substrate, the edges of the plurality of thin film encapsulation layers are provided on the outer wall of the dam or provided on the surface of the display substrate outside the dam, which increases the distance between the edges of the plurality of thin film encapsulation layers and the OLED, so that the distance that the water vapor and oxygen enters from the edges of the plurality of thin film encapsulation layers to the OLED is increased, permeation of the water vapor and oxygen from the edges of the plurality of thin film encapsulation layers into the OLED is delayed and thus the service life of the OLED and the OLED display device is prolonged.

According to embodiments of the disclosure, there is provided an OLED display device. The OLED display device comprises: a display substrate 1, the display substrate 1 having a display region 01 and a peripheral region 02 provided outside the display region 01; a dam 30, formed in the peripheral region 02 of the display substrate 1; and a plurality of thin film encapsulation layers 40, formed on the display substrate 1 and enveloping the dam 30 therein. In the OLED display device, edges of the plurality of thin film encapsulation layers 40 are provided on the outer wall of the dam 30, or the edges of the plurality of thin film encapsulation layers 40 are provided on the surface of the display substrate 1 provided outside the dam 30. The above descriptions may be referred to for specific structures and technical effects of the OLED display device, which will not be repeated here.

The foregoing embodiments merely are exemplary embodiments of the disclosure, and not intended to define the scope of the disclosure, and the scope of the disclosure is determined by the appended claims.

The disclosure claims priority to and contains subject matters related to that disclosed in Chinese Priority Patent Application CN201410381365.3 filed on Aug. 5, 2014, the entire content of which is hereby incorporated by reference.

What is claimed is:

1. An encapsulation method of an organic light-emitting diode (OLED) display device, comprising;
providing a display substrate, the display substrate having a display region and a peripheral region provided outside the display region;
forming a dam in the peripheral region of the display substrate; and
forming a plurality of thin film encapsulation layers on the display substrate by using a single mask plate, wherein the plurality of thin film encapsulation layers envelop the dam therein;
the display region of the display substrate has a plurality of pixel units arranged in a matrix;
the display substrate comprises: a pixel defining layer for defining the plurality of pixel units; and a planarization layer provided below the pixel defining layer and planarizing the display substrate; and
the method comprising: forming the dam on the planarization layer, and forming the pixel defining layer between the dam and the plurality of thin film encapsulation layers, wherein the pixel defining layer envelops the dam therein.

2. The encapsulation method according to claim 1, comprising:
integrally forming the dam with the planarization layer.

3. The encapsulation method according to claim 1, wherein
the mask plate has an opening, and the opening is larger than or equal to a region surrounded by an outmost edge of the dam;
upon placing the mask plate on the display substrate, the opening just exposes the whole dam; or upon placing the mask plate on the display substrate, the opening exposes the whole dam and further exposes a portion of the surface of the display substrate which is provided outside the dam.

4. The encapsulation method according to claim 1, wherein
a shape of a cross section of the dam taken along a direction perpendicular to the display substrate is a trapezoid with a width of an upper side less than a width of a lower side or a rectangular with the width of the upper side equal to the width of the lower side.

5. The encapsulation method according to claim 1, wherein
the dam is formed as an endless closed ring so as to surround the display region.

6. An organic light-emitting diode(OLED) display device, comprising:
a display substrate, having a display region and a peripheral region provided outside the display region;
a dam, formed in the peripheral region of the display substrate; and
a plurality of encapsulation layers, formed on the display substrate and enveloping the dam therein, wherein the display region of the display substrate has a plurality of the pixel units arranged in a matrix;
the display substrate comprising: a pixel defining layer for defining the plurality of pixel units; and a planarization layer provided below the pixel defining layer and planarizing the display substrate; and
the dam is formed on the planarization layer, the pixel defining layer is formed between the dam and the plurality of thin film encapsulation layers, and the pixel defining layer envelops the dam therein.

7. The display device according to claim 6, wherein the dam is integrally formed with the planarization layer.

8. The display device according to claim 6, wherein edges of the plurality of thin film encapsulation layers are provided on an outer wall of the dam, or the edges of the plurality of thin film encapsulation layers are provided on a portion of a surface of the display substrate which is provided outside the dam.

9. The display device according to claim 6, wherein
a shape of a cross section of the dam taken along a direction perpendicular to the display substrate is a trapezoid with a width of an upper side less than a width of a lower side or a rectangular with the width of the upper side equal to the width of the lower side.

10. The display device according to claim 6, wherein the dam is formed as an endless closed ring so as to surround the display region.

11. The encapsulation method according to claim 1, wherein
each pixel unit comprising an OLED and a driving thin film transistor for driving the OLED; and
the dam is formed to be higher than the OLED on the display substrate.

12. The display device according to claim 6, wherein
each pixel unit comprising an OLED and a driving thin film transistor for driving the OLED; and
the dam is formed to be higher than the OLED on the display substrate.

13. An organic light-emitting diode (OLED) display device, comprising:
a display substrate, having a display region and a peripheral region provided outside the display region;
a dam, formed in the peripheral region of the display substrate; and
a plurality of encapsulation layers, formed cm the display substrate and enveloping the dam therein, wherein
the display region of the display substrate has a plurality of pixel units arranged in a matrix, and each pixel unit comprising an OLED and a driving thin film transistor for driving the OLEO;
the display substrate comprises: a pixel defining layer for defining the plurality of pixel units; a planarization layer provided below the pixel defining layer and planarizing the display substrate; and a passivation layer provided below the planarization layer and separating the driving TFT from the OLED; and
the dam is formed on the passivation layer, the planarization layer and the pixel defining layer are sequentially formed between the dam and the plurality of thin film encapsulation layers, and the planarization layer and the pixel defining layer envelop the dam therein.

14. The display device according to claim 13, wherein the dam is integrally formed with the passivation layer.

15. The display device according to claim 13, wherein edges of the plurality of thin film encapsulation layers are provided on an outer wall of the dam, or the edges of the plurality of thin film encapsulation layers are provided on a portion of a surface of the display substrate which is provided outside the dam.

16. The display device according to claim 13, wherein a shape of a cross section of the dam taken along a direction perpendicular to the display substrate is a trapezoid with a width of an upper side less than a width of a lower side or a rectangular with the width of the upper side equal to the width of the lower side.

17. The display device according to claim 13, wherein the dam is formed as an endless closed ring so as to surround the display region.

18. The display device according to claim 13, wherein the dam is formed to be higher than the OLED on the display substrate.

19. An encapsulation method of the OLED display device according to claim 13, comprising:
provide the display substrate;
forming the dam in the peripheral region of the display substrate;
forming the plurality of thin film encapsulation layers on the display substrate by using a single mask plate; and
forming the dam on the passivation layer, and sequentially forming the planarization layer and the pixel defining layer between the dam and the plurality of thin film encapsulation layers, wherein the planarization layer and the pixel defining layer envelop the dam therein.

20. The encapsulation method according to claim 19, wherein
the mask plate has an opening, and the opening is larger than or equal to a region surrounded by an outmost edge of the dam;
upon placing the mask plate on the display substrate, the opening just exposes the whole dam; or upon placing the mask plate on the display substrate, the opening exposes the whole dam and further exposes a portion of the surface of the display substrate which is provided outside the dam.

* * * * *